US012571842B2

(12) United States Patent
Kuramoto

(10) Patent No.: US 12,571,842 B2
(45) Date of Patent: Mar. 10, 2026

(54) JTAG-BASED APPARATUS AND METHOD FOR INPUT CLOCK FREQUENCY MEASUREMENT

(71) Applicant: Xilinx, Inc., San Jose, CA (US)

(72) Inventor: Randal M. Kuramoto, San Jose, CA (US)

(73) Assignee: XILINX, INC., San Jose, CA (US)

( * ) Notice: Subject to any disclaimer, the term of this patent is extended or adjusted under 35 U.S.C. 154(b) by 54 days.

(21) Appl. No.: 18/792,138

(22) Filed: Aug. 1, 2024

(65) Prior Publication Data

US 2026/0036624 A1 Feb. 5, 2026

(51) Int. Cl.
G01R 31/3185 (2006.01)
G01R 31/317 (2006.01)

(52) U.S. Cl.
CPC ............... G01R 31/318552 (2013.01); G01R 31/31723 (2013.01); G01R 31/31726 (2013.01); G01R 31/31727 (2013.01); G01R 31/318533 (2013.01); G01R 31/318572 (2013.01); G01R 31/318597 (2013.01)

(58) Field of Classification Search
CPC ...... G01R 31/318552; G01R 31/31723; G01R 31/318572; G01R 31/318597; G01R 31/318533; G01R 31/31726; G01R 31/31727
USPC .................................................. 714/731, 727
See application file for complete search history.

(56) References Cited

U.S. PATENT DOCUMENTS

| | | | |
|---|---|---|---|
| 8,937,496 B1 * | 1/2015 | Ahmad .................... | H03K 5/19 |
| | | | 327/39 |
| 2007/0052487 A1 * | 3/2007 | Naujokat ......... | G01R 31/31725 |
| | | | 331/2 |
| 2007/0192658 A1 * | 8/2007 | Pedersen .......... | G01R 31/31725 |
| | | | 714/724 |
| 2012/0027159 A1 * | 2/2012 | Jindal .............. | G01R 31/31727 |
| | | | 377/107 |
| 2013/0002318 A1 * | 1/2013 | Lu ........................... | H03L 7/099 |
| | | | 327/156 |
| 2014/0035650 A1 * | 2/2014 | Zerbe .................... | H03L 7/0995 |
| | | | 327/299 |
| 2025/0264508 A1 * | 8/2025 | Mohammed ........... | H03H 11/04 |

OTHER PUBLICATIONS

Tekumalla et al., On-Chip Clock Testing and Frequency Measurement, 2014, IEEE, pp. 11-14. (Year: 2014).*
IEEE Standards Association, "IEEE Standard for Test Access Port and Boundary-Scan Architecture," IEEE Std 1149.1, IEEE Computer Society, May 13, 2013, New York, NY, 444 pages.

* cited by examiner

*Primary Examiner* — John J Tabone, Jr.
(74) *Attorney, Agent, or Firm* — Slater Matsil, LLP

(57) ABSTRACT

In an implementation, a method may include receiving an input clock at an input pin of a device, the device having a Joint Test Action Group (JTAG) test access port (TAP). The method may also include counting a first number of cycles of a reference clock using a first counter. The method may furthermore include simultaneously counting a second number of cycles of the input clock received at the input pin using a second counter. The method may in addition include calculating a frequency of the input clock based on the counted first number of cycles of the reference clock, the counted second number of cycles of the input clock, and a frequency of the reference clock.

20 Claims, 7 Drawing Sheets

100

200

202 — LOAD THE CLOCK COUNT OPCODE

204 — SET THE COUNT VALUE

206 — START THE COUNTING PROCESS

208 — STOP THE COUNTING PROCESS

210 — RETRIEVE THE RESULT OF THE COUNTING PROCESS

212 — CALCULATE THE INPUT CLOCK FREQUENCY

300

302 — RECEIVE A CLOCK SIGNAL AT AN INPUT PIN OF A DEVICE

304 — COUNT A NUMBER OF REFERENCE CLOCK CYCLES USING A COUNTER

306 — SIMULTANEOUSLY COUNT A NUMBER OF INPUT CLOCK CYCLES RECEIVED AT THE INPUT PIN USING A COUNTER

308 — CALCULATE THE INPUT CLOCK FREQUENCY BASED ON THE NUMBER OF INPUT CLOCK CYCLES, THE NUMBER OF REFERENCE CLOCK CYCLES, AND THE REFERENCE CLOCK FREQUENCY

500

HOST SYSTEM
502

MEMORY
508

RAM
512

STORAGE
SYSTEM
516

HOST
PROCESSOR(S)
506

CACHE
514

PROGRAM/UTILITY
518

PROGRAM
MODULES
120

510

I/O
INTERFACE(S)
528

DISPLAY
530

HARDWARE ACCELERATION CARD
504

IC
532

NON-VOLATILE
MEMORY 534          536

VOLATILE
MEMORY

700

JTAG-BASED APPARATUS AND METHOD FOR INPUT CLOCK FREQUENCY MEASUREMENT

BACKGROUND

The Joint Test Action Group (JTAG) standard, also known as the IEEE Standard 1149.1, is a widely used interface for testing and debugging electronic systems. This standard provides a method for accessing and controlling the internal components of integrated circuits (ICs) and printed circuit boards (PCBs). JTAG allows for various testing and debugging operations, including boundary scan testing, which is particularly useful for verifying interconnections between ICs on a PCB.

The JTAG standard enables the design of ICs with built-in self-test capabilities, facilitates PCB interconnect testing, and supports observation and control of the manufacturing process. Additionally, JTAG provides a framework upon which various system test and debug functions can be implemented, making it a versatile tool in the development and production of electronic devices.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
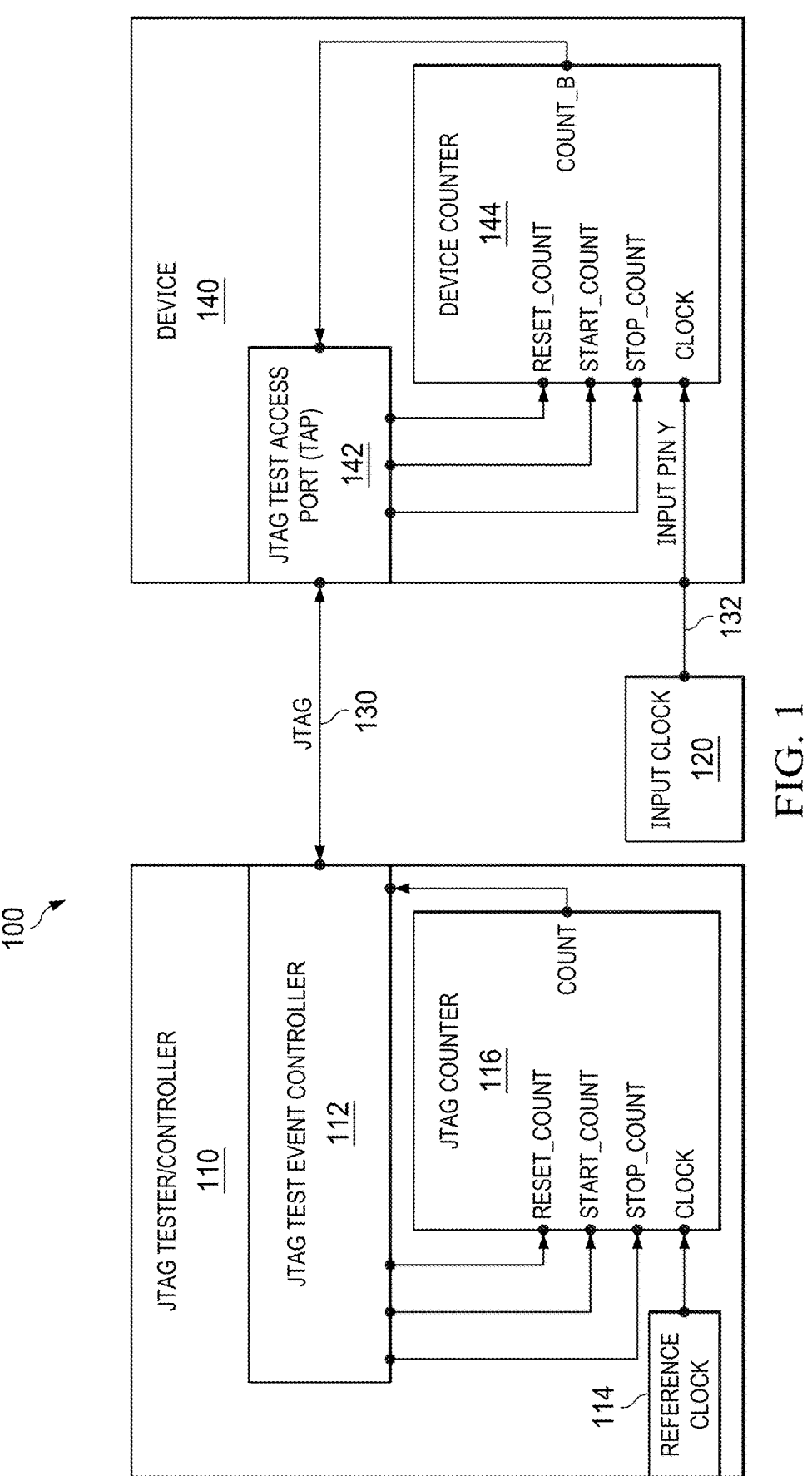
FIG. 1 illustrates a block diagram of a JTAG-based test system for measuring an input clock frequency, according to some implementations.

Corresponding numerals and symbols in the different figures generally refer to corresponding parts unless otherwise indicated. The figures are drawn to clearly illustrate the relevant aspects of the implementations and are not necessarily drawn to scale. The edges of features drawn in the figures do not necessarily indicate the termination of the extent of the feature.

DETAILED DESCRIPTION OF ILLUSTRATIVE IMPLEMENTATIONS

The making and using of various implementations are discussed in detail below. It should be appreciated, however, that the various implementations described herein are applicable in a wide variety of specific contexts. The specific implementations discussed are merely illustrative of specific ways to make and use various implementations, and should not be construed in a limited scope.

Reference to "an implementation," "one implementation," "an embodiment," or "one embodiment" in the framework of the present description is intended to indicate that a particular configuration, structure, or characteristic described in relation to the implementation/embodiment is included in at least one implementation/embodiment. Hence, phrases such as "in one implementation" or "in one embodiment" that may be present in one or more points of the present description do not necessarily refer to one and the same implementation/embodiment. Moreover, particular conformations, structures, or characteristics may be combined in any adequate way in one or more implementations/embodiments. The references used herein are provided merely for convenience and do not define the extent of protection or the scope of the implementations/embodiments.

The present disclosure provides a method and apparatus for measuring the frequency of an input clock using a Joint Test Action Group (JTAG)-based system. This approach extends the capabilities of standard JTAG testing infrastructure to include precise clock frequency measurement, enabling more comprehensive system verification without requiring additional specialized testing equipment. The apparatus can be integrated into a device's IEEE Standard 1149.1 (JTAG) test access port (TAP) logic, allowing for incorporation into existing JTAG-enabled devices.

The present disclosure utilizes a counting mechanism to measure the frequency of an input clock signal. In some implementations, the apparatus includes a first counter that tallies the number of JTAG test clock cycles in a predetermined time interval, and a second counter that tallies the number of input clock cycles occurring within this interval. By comparing these two counts and knowing the frequency of the JTAG test clock, the system can accurately determine the frequency of the input clock. This approach offers several advantages over traditional clock measurement methods, including minimal additional hardware requirements, non-invasive measurement capability, and the ability to leverage existing JTAG infrastructure.

The method and apparatus described herein are particularly valuable for verifying the correctness of clock sources during JTAG board testing. This capability addresses several common challenges in electronic system manufacturing and testing. For instance, it enables the detection of incorrect clock source devices on a board using the cost-effective JTAG method, as opposed to more expensive manufacturing test methods such as optical inspection. In some implementations, the system can also detect programmed clock sources for programmable devices that are not JTAG-capable, as well as identify non-operational or disabled clock sources early in the production test process.

Furthermore, the present disclosure can help prevent more difficult-to-detect or costly debugging scenarios. For example, it can identify cases where a clock source is operating at an incorrect frequency, which might not be discovered until much later in the production process or until failure occurs during end-customer product usage. By providing a means to verify clock frequencies early in the manufacturing process, this method can significantly reduce production costs and improve overall product quality and reliability.

Referring to FIG. 1, a block diagram of a test system 100 for calculating clock frequency using a JTAG-based implementation is illustrated. The system 100 comprises a JTAG tester/controller 110 and a device 140 with a JTAG interface. This system provides a solution for clock frequency measurement that leverages the existing JTAG infrastructure, thereby reducing the need for additional specialized testing equipment.

The JTAG tester/controller 110 includes a JTAG test event controller 112, a reference clock 114, and a JTAG counter 116. The reference clock 114 provides a known frequency for the system operation, which serves as the basis for accurate frequency measurements. The JTAG counter 116 is configured to perform operations such as reset, start count, stop count, and provide count values. These operations are crucial for coordinating the measurement process and ensuring accurate timing. The JTAG test event controller 112 orchestrates the overall measurement process, controlling both the JTAG counter 116 and the device counter 144. The JTAG counter 116 and device counter 144 can be implemented with various bit widths, typically 16-bit, 32-bit, or even 64-bit, depending on the required precision and the expected frequency range of the clocks being measured. Larger bit widths allow for longer measurement periods and higher precision but may come at the cost of increased hardware complexity and power consumption.

An input clock 120 is connected to the device 140 via an input clock connection 132. This input clock 120 represents the clock signal to be measured, which could be an external clock source or an internal clock signal within the device 140. The flexibility to measure both external and internal clock signals enhances the versatility of this system, allowing for comprehensive clock verification across various parts of the electronic system. While FIG. 1 illustrates a single input clock, it's important to note that many devices have multiple clock inputs. The system can be adapted to handle multiple clock inputs by either multiplexing the input to the device counter 144 or by implementing multiple device counters, each associated with a different clock input. The JTAG test event controller 112 can be programmed to sequence through these multiple clock inputs, providing a comprehensive clock verification solution for complex multi-clock systems.

The device 140 includes a JTAG test access port (TAP) 142 and a device counter 144. The JTAG TAP 142 facilitates communication between the JTAG tester/controller 110 and the device 140, serving as the interface through which control signals and measurement data are exchanged. The device counter 144 is configured to perform operations similar to the JTAG counter 116, including reset, start count, stop count, and provide count values. This counter is responsible for measuring the cycles of the input clock 120 during the measurement period.

A JTAG connection 130 links the JTAG tester/controller 110 to the JTAG TAP 142 of the device 140. This connection allows for the transfer of control signals and data between the JTAG tester/controller 110 and the device 140, enabling coordination of the measurement process. The JTAG connection 130 typically consists of several signal lines, including Test Clock (TCK), Test Mode Select (TMS), Test Data In (TDI), and Test Data Out (TDO), which are standard in JTAG implementations. The use of this standardized interface ensures compatibility with a wide range of devices and test equipment, facilitating easy integration into existing test environments.

In operation, the system 100 uses the JTAG tester/controller 110, specifically the JTAG test event controller 112, to initiate and control the counting process in both the JTAG counter 116 and the device counter 144. By comparing the count values from these counters and knowing the frequency of the reference clock 114, the system can determine the frequency of the input clock 120 with high accuracy.

An example of the operation of the system 100 to measure the frequency of the input clock 120 is now described. The process begins with an initialization phase, where the JTAG test event controller 112 sends signals through the JTAG connection 130 to reset both the JTAG counter 116 and the device counter 144 to zero. This initialization ensures that both counters start from a known state, which is important for accurate measurement. The JTAG test event controller 112 may also configure any necessary settings in the device 140, such as enabling the appropriate clock inputs or setting up the device counter 144 for the measurement process.

Following the initialization phase, the JTAG test event controller 112 initiates the counting process. This is done by sending a start command through the JTAG connection 130 to the device 140, which triggers the activation of the device counter 144. Simultaneously, the JTAG test event controller 112 activates the JTAG counter 116 within the JTAG tester/controller 110. The synchronization of starting both counters can ensure accurate relative frequency measurement. Once activated, the JTAG counter 116 begins tallying the cycles of the reference clock 114, while the device counter 144 counts the cycles of the input clock 120.

The counting process continues for a predetermined time interval, which is typically set by the JTAG test event controller 112 based on the expected frequency range of the input clock 120 and the desired measurement accuracy. During this time, both counters operate independently, with the JTAG counter 116 counting cycles of the reference clock 114 and the device counter 144 counting cycles of the input clock 120. The duration is usually controlled by monitoring the JTAG counter 116 until it reaches a preset value. This preset value is chosen to provide a sufficient number of cycles for an accurate measurement while preventing counter overflow.

Once the JTAG counter 116 reaches its preset value, the JTAG test event controller 112 issues a stop signal. This signal is transmitted through the JTAG connection 130 to the device 140, instructing it to halt the device counter 144. Concurrently, the JTAG test event controller 112 stops the JTAG counter 116. The simultaneous stopping of both counters maintains the accuracy of the relative frequency measurement. After the counting process is halted, the counters retain their final values, representing the number of clock cycles counted for their respective clocks during the measurement period.

Following the end of the counting process, the JTAG tester/controller 110 initiates a data retrieval process to obtain the count values from both the device counter 144 and the JTAG counter 116. This retrieval process can be implemented in at least two ways:

In a first implementation, the JTAG test event controller 112 sends a series of commands through the JTAG connection 130 to the JTAG TAP 142 of the device 140. These commands instruct the device 140 to place the value of the device counter 144 into a shift register accessible via the JTAG TAP 142. The JTAG tester/controller 110 then shifts this data out, typically in a serial fashion, through the JTAG connection 130.

In a second implementation, in addition to retrieving the device counter 144 value, the JTAG test event controller 112 also retrieves the actual count value from the JTAG counter 116. This approach allows for greater precision in cases where the JTAG counter 116 may not have reached exactly the preset value when the counting was stopped.

Both implementations allow the JTAG tester/controller 110 to obtain the precise number of clock cycles counted during the measurement period for both the input clock 120 and the reference clock 114.

Upon receiving the count values, the JTAG test event controller 112 proceeds to calculate the frequency of the input clock 120. This calculation utilizes three primary pieces of data: the known frequency of the reference clock 114, the count value from the JTAG counter 116, and the retrieved count value from the device counter 144.

In the first implementation, where a preset count value is used for the JTAG counter 116, the calculation uses the following formula:

> Input Clock Frequency=Reference Clock Frequency*Device Counter Value/Preset JTAG Counter Value In the second implementation, where the actual count value is retrieved from the JTAG counter 116, the calculation uses this modified formula:

> Input Clock Frequency=Reference Clock Frequency*Device Counter Value/Actual JTAG Counter Value Both formulas are based on the principle that the ratio of the clock frequencies is inversely proportional to the ratio of their respective cycle counts over the same time period. The JTAG test event controller 112 may be programmed to perform either calculation automatically upon receiving the necessary data, storing the result for further analysis or reporting. The second implementation may provide increased accuracy, especially in scenarios where precise timing control of the measurement period is challenging.

To illustrate the practical application of this frequency measurement system, consider the following example calculation:

Reference Clock Frequency=100 MHz

JTAG Counter Value=1000 clock cycles

Device Counter Value=2000 clock cycles

Applying the formula: Input Clock Frequency=100 MHz*2000/1000=200 MHz

In this scenario, the calculation reveals that during the time it took for the reference clock 114 to complete 1000 cycles, the input clock 120 completed 2000 cycles. This data, combined with the known frequency of the reference clock 114, allows the system to determine that the input clock 120 is operating at 200 MHz.

The example provided demonstrates the system's capability to measure an input clock frequency that differs from the reference clock frequency. In the given case, the calculation indicates that the input clock 120 operates at twice the speed of the reference clock 114. This ability to measure clock frequencies that are not identical to the reference clock is a significant feature of the system, allowing for the testing and verification of a wide range of clock speeds. The system can theoretically measure frequencies that are higher or lower than the reference clock, limited primarily by the resolution of the counters and the stability of the clocks over the measurement period.

The system 100 is designed with the flexibility to test various clock configurations, accommodating different frequency ratios between the reference clock 114 and the input clock 120. This versatility is valuable in manufacturing and testing environments where devices with diverse clock requirements may need to be verified. The measurement accuracy of the system depends on several factors, including the precision and stability of the reference clock 114, the resolution of both the JTAG counter 116 and the device counter 144, and the duration of the measurement period. Higher precision in the reference clock 114 and larger bit widths in the counters generally contribute to more accurate measurements. The system may be configured with different counter sizes or measurement durations to balance accuracy requirements with testing time constraints.

To further enhance the accuracy of the frequency measurement, particularly for input clocks that are not integer multiples of the reference clock frequency, the system 100 can be programmed to perform multiple measurements and calculate an average. This technique, often referred to as oversampling, helps to mitigate the effects of random fluctuations, jitter, or small inconsistencies in the clock signals. The JTAG test event controller 112 can be configured to automatically repeat the measurement process a specified number of times, storing each result. After collecting multiple measurements, the controller can calculate statistical measures such as the mean frequency, standard deviation, and confidence intervals. This statistical approach can provide a more comprehensive and reliable characterization of the input clock frequency, especially in situations where high precision is required or when dealing with clock sources that may have inherent instabilities.

This approach allows the JTAG tester/controller 110 to measure and verify the frequency of an external clock source (input clock 120) connected to the device under test without requiring additional external frequency measurement equipment. The use of the JTAG interface, which is commonly implemented for other testing and debugging purposes, provides a standardized and widely supported method for accessing the internal counter and controlling the measurement process. This capability offers significant advantages in manufacturing testing and verification processes, enabling efficient clock frequency verification as part of a broader JTAG-based test regime.

The disclosed implementations offer several advantages over traditional clock measurement methods. Firstly, they utilize the existing JTAG infrastructure, eliminating the need for additional specialized testing equipment. This can significantly reduce testing costs and simplify the testing process. Secondly, the implementations can be applied at various stages of the manufacturing and testing process, from initial board assembly to final product verification, providing a consistent and reliable means of clock frequency measurement throughout the product lifecycle.

Moreover, the system 100 can be used to verify the correctness of clock sources during JTAG board testing. This capability is particularly valuable in detecting issues such as incorrect clock source devices, improperly programmed programmable clock sources, and non-operational or disabled clock sources early in the production process. Early detection of these issues can prevent more costly problems from arising later in the production process or during end-customer product usage.

The system's flexibility allows it to measure a wide range of clock frequencies, including those that are slower, faster, or the same as the reference clock 114 frequency. This versatility ensures that the system can be used across a variety of electronic devices with different clock requirements, making it a valuable tool for manufacturers of diverse electronic products. However, it's important to note that there are practical limitations to the system's capabilities. The maximum measurable frequency is limited by the speed of the device counter 144 and the JTAG interface itself. The minimum frequency difference that can be detected depends on the measurement duration and the precision of the counters. Longer measurement periods and higher-precision counters allow for the detection of smaller frequency differences, but at the cost of increased test time and potentially higher power consumption.

The clock measurement system described herein can be applied to measure the frequency and stability of recovered clocks in serial communication links. In high-speed serial interfaces, data is often transmitted without a separate clock signal. Instead, the receiver employs clock data recovery (CDR) techniques to extract timing information from the incoming data stream and reconstruct a clock signal for sampling the received data.

The device under test may include one or more serial interfaces with CDR circuits. In such configurations, the device can be adapted to route the recovered clock signal from a CDR circuit to the input of the device counter. This routing may be implemented through internal multiplexing logic, allowing the device to select between external clock inputs and internally recovered clocks for measurement.

To enable measurement of recovered clocks, the JTAG instruction set of the device can be extended to include commands for configuring the internal multiplexing logic. These instructions allow the JTAG controller to select the recovered clock as the input to the device counter. The measurement process for the recovered clock follows the same principle as for external clocks, with the device counter tallying cycles of the recovered clock while the JTAG counter measures a known reference time period.

Measuring the frequency of recovered clocks serves several purposes in the context of serial communications. The frequency of the recovered clock corresponds directly to data rate of the serial link, allowing confirmation that the link is operating at the expected speed. The measurement results can be used as feedback for adjusting or calibrating the CDR circuit parameters, potentially improving link performance. The ability to measure recovered clock frequencies through the JTAG interface enables testing of high-speed serial interfaces without requiring expensive external test equipment. Additionally, periodic measurements of recovered clock frequencies can be performed in deployed systems, allowing for ongoing performance monitoring and early detection of potential issues.

In some implementations, the system 100 may include additional features to enhance its functionality and reliability. For example, it may incorporate error detection mechanisms within the JTAG test event controller 112 or the device 140 to identify irregular clock signals or non-toggling clock inputs. These features can provide valuable diagnostic information, further improving the system's ability to detect and isolate clock-related issues. Specific types of errors that might be encountered include a non-toggling clock where the system can detect if the input clock 120 is not toggling at all, which could indicate a failed or disconnected clock source. Another error type is when the measured frequency is significantly outside the expected range, it could indicate a misconfigured or incorrect clock source. The system 100 can also detect an unstable clock where significant variations in the measured frequency across multiple measurements could indicate an unstable clock source. Finally, the system 100 may be able to detect a counter overflow error where the device counter 144 overflows during the measurement period as that could indicate an unexpectedly high input clock frequency.

The system can be programmed to handle these errors by flagging them for further investigation, automatically adjusting measurement parameters for a retry, or logging detailed diagnostic information for later analysis.

The JTAG tester/controller 110 may also include additional components not shown in the figure, such as memory for storing test patterns and results, a user interface for configuring test parameters, and communication interfaces for connecting to other test equipment or data logging systems. These additional components enhance the overall functionality and usability of the test system 100.

Although FIG. 1 shows a single device 140 under test, the system 100 can be extended to test multiple devices simultaneously. This can be achieved by connecting multiple devices to the JTAG tester/controller 110 in a daisy-chain configuration, allowing for efficient testing of complex electronic systems with multiple clock domains.

The clock measurement system can be integrated with other JTAG-based tests to create a comprehensive test suite. For example, it can be combined with boundary scan tests for interconnect testing, built-in self-test (BIST) for logic testing, and in-system programming for firmware updates. This integration allows for a holistic approach to device testing, where clock frequency verification is just one part of a broader test strategy. The JTAG test event controller 112 can be programmed to execute a sequence of tests, including clock frequency measurements, providing a streamlined and efficient testing process.

Power consumption can a consideration of this testing method, especially for battery-powered or low-power devices. The clock measurement system, while efficient, does consume power during the testing process. The power consumption is primarily due to the operation of the device counter 144 and the JTAG interface. For devices that are particularly power-sensitive, the system can be configured to minimize power consumption by optimizing the measurement duration and frequency. For instance, the system could be programmed to use shorter measurement periods or to perform measurements less frequently. Additionally, in some implementations, the device counter 144 could be designed to be power-gated when not in use, further reducing power consumption in standby mode.

The system's flexibility extends to its ability to handle various clock types and configurations. While the basic principle remains the same, the system can be adapted to measure different clock characteristics. For instance, with appropriate modifications, it could be used to measure clock duty cycles, detect clock jitter, or even characterize spread spectrum clocking schemes. These advanced capabilities could be implemented through software updates to the JTAG test event controller 112, potentially extending the system's utility throughout the lifecycle of the device.

One potential challenge in implementing this system is managing the trade-off between measurement accuracy and test time. Longer measurement periods generally provide more accurate results but increase the overall test time, which can be a critical factor in high-volume manufacturing environments. To address this, the system could implement adaptive measurement strategies. For example, it could start with a short measurement period for a quick estimate of the clock frequency, and then adjust the measurement time based on the initial result and the required accuracy. This approach could optimize the balance between test thoroughness and production efficiency.

The clock measurement system described here can also help in device characterization and quality control processes. By providing accurate clock frequency measurements, it allows manufacturers to verify that devices are operating within their specified frequency ranges. This is particularly important for devices that need to function across a wide range of operating conditions, such as temperature variations or different power supply voltages. The system could be used as part of a broader characterization process, measuring clock frequencies under various environmental conditions to ensure robust device performance.

The data collected from this clock measurement system can be valuable beyond the immediate testing phase. By logging and analyzing clock frequency data over time and across multiple devices, manufacturers can gain insights into production trends, identify potential quality issues early, and refine their manufacturing processes. This data-driven approach could lead to improvements in yield rates and overall product quality. The JTAG tester/controller 110 could be equipped with data logging and analysis capabilities to facilitate this type of long-term trend analysis.

The clock frequency measurement system described in this document represents a versatile and efficient approach to verifying clock operations in electronic devices. By utilizing the widely adopted JTAG interface, it provides a standardized method for clock characterization that can be easily integrated into existing test and manufacturing processes. The system's flexibility, coupled with its potential for high accuracy and its ability to handle a wide range of clock frequencies, makes it a valuable tool for ensuring the quality and reliability of clock-dependent electronic systems. As the complexity of electronic devices continues to increase, such efficient and adaptable testing methodologies will help to maintain high standards of product quality and performance.

Figure 2:
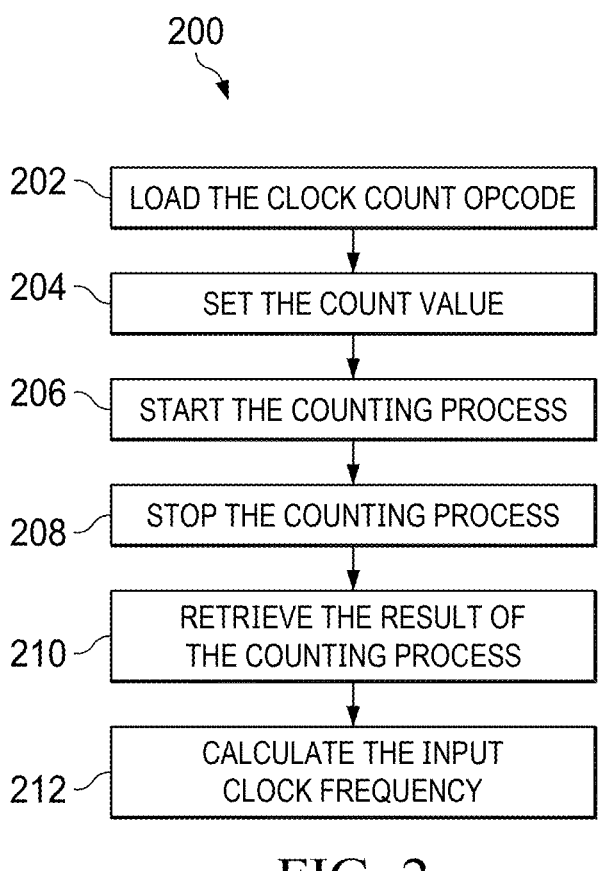
FIG. 2 illustrates a flowchart of a method for measuring an input clock frequency, according to some implementations.

FIG. 2 is a flowchart of an example process 200 for measuring the frequency of an input clock signal using a JTAG-based system. In some implementations, one or more process blocks of FIG. 2 may be performed by a device with a JTAG interface, such as the device 140 shown in FIG. 1. This process 200 provides an approach to implementing the clock frequency measurement system described in relation to FIG. 1.

As shown in FIG. 2, process 200 begins with the JTAG tester/controller loading the Clock Count (CC) opcode (step 202). For example, the JTAG tester/controller 110 may load the clock count (CC) opcode into the device 140 via the JTAG connection 130. This step initializes the device for the clock counting operation, setting up the necessary internal configurations to enable the measurement process. The process then moves to setting the count limit (step 204). For example, the JTAG test event controller 112 may set the count limit in the JTAG counter 116 of the device 140. This value determines the duration of the measurement period and can be adjusted based on the expected frequency range of the input clock and the desired measurement accuracy.

Next, the process includes starting the counting process (step 206). For example, the device 140 may simultaneously start the JTAG counter 116 and the device counter 144 to count cycles of the reference clock 114 and the input clock 120, respectively. The simultaneous start maintains the accuracy of the relative frequency measurement. This is followed by stopping the counting process (step 208). For example, the device 140 may stop both counters when the JTAG counter 116 reaches the count limit. The timing of the stop signal ensures that both counters stop counting at the same instant, preserving the relationship between the counted values.

After stopping the counting process, the next step involves retrieving the count result (step 210). For example, the JTAG tester/controller 110 may retrieve the count result from the device counter 144 via the JTAG connection 130. This step may involve multiple JTAG operations to shift out the counter value, depending on the counter size and the JTAG data register configuration. Finally, the process concludes with calculating the input clock frequency (step 212). For example, the JTAG test event controller 112 may calculate the frequency of the input clock 120 based on the count result, the count limit, and the known frequency of the reference clock 114.

Although FIG. 2 shows example blocks of process 200, in some implementations, process 200 may include additional blocks, fewer blocks, different blocks, or differently arranged blocks than those depicted in FIG. 2. Additionally or alternatively, two or more of the blocks of process 200 may be performed in parallel. For instance, the process could be extended to include error checking steps after each major operation, or to include multiple measurement cycles for improved accuracy.

The method illustrated in FIG. 2 leverages the apparatus described in relation to FIG. 1 and provides a systematic approach to clock frequency measurement using the JTAG interface. This method offers several advantages. It requires minimal additional hardware beyond the standard JTAG interface, making it easy to implement in a wide range of devices. The measurement can be performed without interrupting normal system operation, making it suitable for both manufacturing tests and in-field diagnostics. By leveraging the JTAG standard, this method can be incorporated into existing test infrastructures and workflows, providing a high degree of standardization and interoperability.

The method's reliance on the JTAG interface also allows for remote or automated clock frequency measurement. For example, in a data center environment, server management software could periodically check the clock frequencies of critical components across multiple servers without requiring physical access to the hardware. This could help detect potential issues before they lead to system failures. In the context of Internet of Things (IoT) devices, this method could be used for remote diagnostics, allowing for clock frequency verification in deployed devices without the need for physical access.

In complex System-on-Chip (SoC) designs, this method could be used to verify the operation of clock management units and phase-locked loops (PLLs). By measuring the frequencies of various internal clocks, designers can ensure that clock generation and distribution circuits are functioning as intended across different power modes and operating conditions. This capability can be useful in modern SoCs that often incorporate multiple clock domains and dynamic frequency scaling techniques.

Error handling is an aspect of this method that requires consideration. Potential errors that might occur include counter overflow, loss of JTAG communication during the measurement process, or detection of clock frequencies outside of expected ranges. The implementation should include error detection and handling mechanisms. For example, if a counter overflow is detected, the system could automatically adjust the COUNT value and retry the measurement. If clock frequencies are found to be out of range, the system could trigger additional diagnostic tests or alert system management software.

Figure 3:
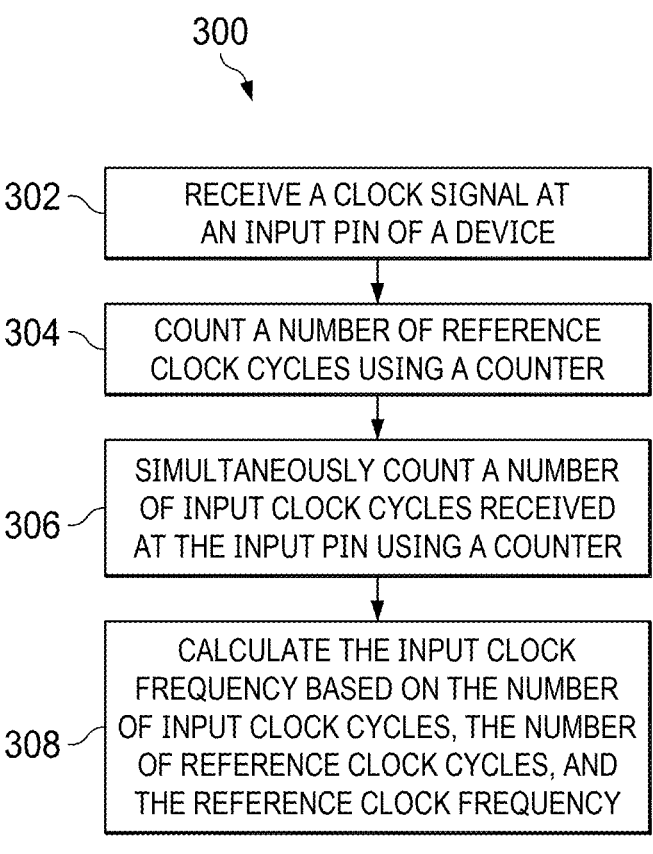
FIG. 3 illustrates a flowchart of a method for measuring an input clock frequency, according to some implementations.

Referring to FIG. 3, a flowchart illustrating another method 300 for measuring the frequency of an input clock using a JTAG-based system is presented. This method provides an approach to clock frequency measurement that may be suitable for certain types of systems or measurement scenarios. While it shares some similarities with the method described in FIG. 2, it offers a different perspective on the measurement process, potentially providing advantages in certain applications.

The method begins with receiving a clock signal at an input pin of a device (step 302). This input clock signal is the one whose frequency is to be measured. For example, the input clock 120 may be received at a designated pin of the device 140 shown in FIG. 1. The input pin could be a dedicated clock input or a general-purpose I/O pin configured to receive a clock signal. This flexibility allows the method to be used with a variety of clock sources and system configurations. In some SoC designs, this "pin" might actually be an internal node within the chip, allowing for measurement of internally generated or distributed clocks.

The method then proceeds with counting a designated number of TCK clock cycles using a first counter (step 304). The TCK clock is the test clock signal used in JTAG operations and has a known frequency. This counter could be implemented as the JTAG counter 116 shown in FIG. 1. It could be configured as a down counter initialized with the designated number of TCK cycles to count, or as an up counter that is compared against the designated number. The use of the TCK clock as a time base provides a stable and well-defined measurement period. The choice between an up-counter or down-counter implementation may depend on the specific hardware resources available and the desired behavior when the count is complete.

Simultaneously, the method involves counting the number of input clock cycles received at the input pin using a second counter (step 306). This simultaneous counting allows for a direct comparison between the known TCK clock and the input clock whose frequency is being measured. The second counter, which could be implemented as the device counter 144 shown in FIG. 1, is typically configured as an up counter, starting from zero and counting each cycle of the input clock. The simultaneous operation of these two counters establishes a precise relationship between the two clock domains.

After the counting is complete, the method concludes with calculating the input clock frequency (step 308). This calculation is based on the counted number of input clock cycles and the designated number of TCK clock cycles. By knowing the frequency of the TCK clock and the ratio of input clock cycles to TCK clock cycles, the frequency of the input clock can be determined. This calculation could be performed by the JTAG test event controller 112 shown in FIG. 1. The calculation process may also include additional steps for error checking or statistical analysis, especially if multiple measurements are taken.

This method offers several advantages. It is adaptable, as the designated number of TCK clock cycles can be adjusted based on the expected frequency range of the input clock. For high-frequency input clocks, a smaller number of TCK cycles might be used to prevent counter overflow, while for low-frequency clocks, a larger number could be used to improve measurement accuracy. This adaptability makes the method suitable for a wide range of clock frequencies, from low-speed real-time clocks to high-speed system clocks.

The method is also flexible in terms of implementation. It can be extended to perform repeated measurements over time, allowing for the detection of frequency drift or intermittent clock issues. This could be useful in systems where clock stability is a factor, such as in telecommunications equipment or precision timing applications. By performing multiple measurements and analyzing the results over time, the system could detect subtle changes in clock behavior that might indicate developing issues.

The method's reliance on the JTAG interface makes it suitable for implementation in field-programmable gate arrays (FPGAs) and other programmable logic devices. These devices often have flexible clock management systems and can easily implement the required counters and control logic. The method could be included as a standard feature in the FPGA's JTAG infrastructure, providing system designers with a built-in tool for clock verification and debugging. This could be valuable during the prototyping and development phases of a project, allowing for verification of clock configurations.

In system-on-chip (SoC) designs, this method could be used to verify the operation of clock distribution networks and frequency synthesis circuits. By measuring the frequencies of various internal clocks derived from a common reference, designers can ensure that clock dividers and multipliers are functioning correctly across different operating modes and conditions. This capability could be useful in complex SoC designs that incorporate multiple clock domains, dynamic frequency scaling, or adaptive clocking schemes.

The method can also be valuable in production testing environments, where it can be used to implement a rapid go/no-go test for clock integrity. By verifying that all clock signals in a system are within their expected frequency ranges, manufacturers can detect a range of potential issues early in the testing process, before running more time-consuming functional tests. This could improve test efficiency and reduce overall production costs.

The method illustrated in FIG. 3 provides a versatile approach to clock frequency measurement that can be adapted to a range of applications and scenarios. Its integration with the JTAG interface makes it a cost-effective and standardized solution for clock verification, suitable for use throughout the lifecycle of an electronic product, from initial development and debugging through production testing and in-field diagnostics. As the complexity of electronic systems continues to increase, such flexible and efficient testing methodologies will play a role in ensuring the reliability and performance of clock-dependent systems.

Figure 4:
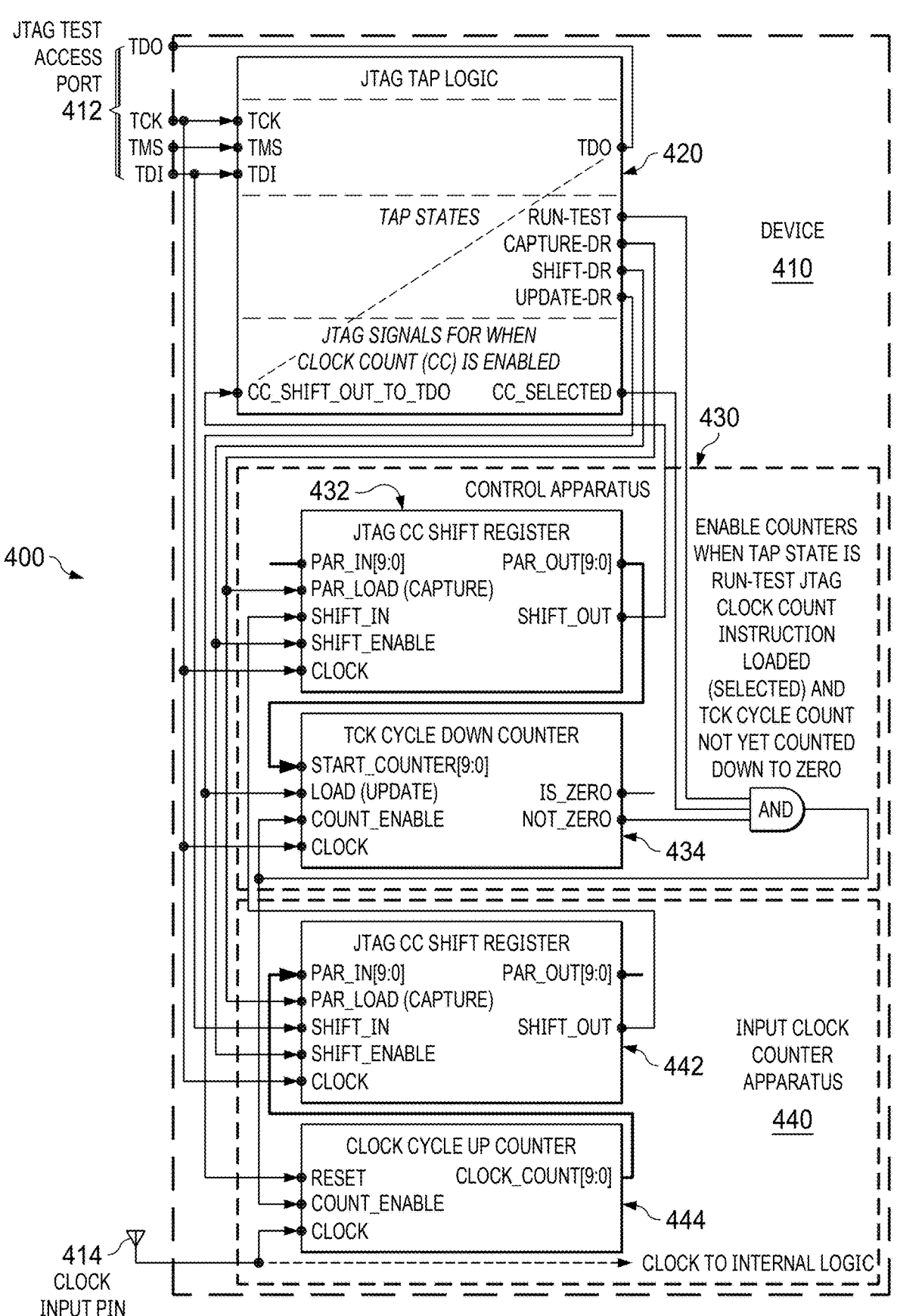
FIG. 4 illustrates a block diagram of an apparatus for measuring an input clock frequency, according to some implementations.

Referring to FIG. 4, a block diagram of an apparatus 400 for measuring clock frequency using a JTAG-based system is illustrated. The apparatus 400 is implemented within a device 410 that has JTAG capability. This implementation allows for the integration of clock measurement functionality into existing JTAG-capable devices with minimal additional hardware, providing a cost-effective solution for clock frequency verification.

The device 410 comprises a JTAG test access port (TAP) 412 that interfaces with external JTAG test equipment. This TAP 412 serves as the primary communication channel between the device and the external JTAG controller, facilitating the exchange of control signals, configuration data, and measurement results. The TAP 412 in this implementation corresponds to the JTAG TAP 142 described in FIG. 1, maintaining consistency in the overall system architecture.

A clock input pin 414 receives an input clock to be measured. This input can be connected to various clock sources, including external oscillators, clock distribution networks, or internal clock generators, providing flexibility in the types of clock signals that can be measured. This clock input pin 414 is analogous to the input clock connection 132 shown in FIG. 1.

The JTAG TAP logic 420 manages the JTAG interface and controls the overall operation of the measurement system. This logic interprets JTAG instructions, manages the state transitions as defined in the TAP state diagram, and coordinates the operation of the clock measurement apparatus. The JTAG TAP logic 420 incorporates the functionality of the JTAG test event controller 112 described in FIG. 1, but is implemented within the device under test rather than in the external JTAG tester/controller.

The apparatus 400 includes a supplemental control apparatus 430, which contains a JTAG CC shift register 432 and a TCK cycle down counter 434. The JTAG CC shift register 432 is used to load and shift data related to the clock count operation, allowing for efficient data transfer between the external JTAG controller and the measurement apparatus. This shift register can be used to load the initial count value for the TCK cycle down counter 434, as well as to shift out the final count value from the clock cycle up counter 444.

The TCK cycle down counter 434 can either count down a predetermined number of TCK cycles or for a predetermined time interval to control the duration of the measurement, providing a flexible means of setting the measurement period based on the expected frequency range of the input clock. This counter is analogous to the JTAG counter 116 described in FIG. 1, but implemented as a down counter for more efficient control of the measurement duration.

An input clock counter 440 is implemented at the clock input pin 414. This counter includes another JTAG CC shift register 442 and a clock cycle up counter 444. The clock cycle up counter 444 counts the cycles of the input clock during the measurement period, providing the raw data needed to calculate the input clock frequency. This counter corresponds to the device counter 144 described in FIG. 1.

The JTAG TAP logic 420 controls the operation of both the supplemental control apparatus 430 and the input clock counter 440. It manages the TAP states, including capture, shift, and update operations for the JTAG CC shift registers, ensuring proper synchronization between the JTAG interface and the measurement apparatus. This control mechanism allows for precise timing of the start and stop of the counting process, which is essential for accurate frequency measurement.

The supplemental apparatus 400 can be implemented with a small amount of logic at the clock input pins. This allows for a compact and efficient design that can be easily integrated into the device 410, minimizing the impact on overall chip area and power consumption. This approach aligns with the goal of leveraging existing JTAG infrastructure for clock measurement, as discussed in the description of FIG. 1.

A supplemental JTAG clock count (CC) instruction opcode is implemented in the JTAG TAP logic 420 to result in the assertion of a CC_SELECTED signal when the CC instruction opcode is loaded in the JTAG instruction register. This signal indicates that the supplemental apparatus 400 is selected and ready for operation, allowing for integration with existing JTAG operations. This implementation detail provides insight into how the clock measurement functionality is activated within the standard JTAG instruction framework.

The apparatus 400 operates by loading a start count value into the TCK cycle down counter 434, enabling the clock cycle up counter 444, and then counting input clock cycles until the TCK cycle down counter 434 reaches zero. The final count from the clock cycle up counter 444 is then captured and shifted out through the JTAG TAP 412 for external processing to determine the input clock frequency. This process allows for precise measurement of the input clock frequency while minimizing the complexity of the on-chip logic.

In some implementations, the apparatus 400 also includes overflow detection. For example, an overflow detection circuit can be added to the clock cycle up counter 444 to handle cases where the input clock frequency is significantly higher than expected. This overflow detection can trigger an interrupt or set a status flag, allowing the external JTAG controller to adjust the measurement parameters and retry the measurement with a shorter counting period.

In some implementations, the apparatus 400 also includes a prescaler. For example a prescaler circuit can be included before the clock cycle up counter 444. This prescaler could divide the input clock frequency by a selectable factor, allowing the apparatus to measure a wider range of input frequencies without requiring a larger counter. The prescaler division factor could be set via the JTAG interface, providing runtime configurability to adapt to different measurement scenarios.

In some implementations, the apparatus 400 also includes the ability to measure multiple clocks. For example, the apparatus 400 can support measurement of multiple clock inputs by implementing multiple instances of the input clock counter 440, each connected to a different clock input pin. A multiplexer controlled by the JTAG TAP logic 420 could then select which counter's value is shifted out for measurement. This multi-clock measurement capability is particularly valuable in complex systems-on-chip (SoCs) that utilize multiple clock domains.

In some implementations, the apparatus 400 also a backup or reference clock. For example, a local oscillator with a known frequency can be included in the apparatus 400. This local oscillator could be used to verify the integrity of the JTAG TCK clock, ensuring the accuracy of the measurement system even if the external JTAG controller's clock source is compromised. The backup oscillator could also be used as a reference for measuring internal clock sources when the JTAG interface is not active, expanding the usefulness of the measurement apparatus beyond manufacturing test scenarios.

Power considerations are addressed in the design of the apparatus 400. A low-power standby mode can be implemented where most of the circuitry is powered down except for a small amount of logic that can still detect a JTAG command to wake up the full measurement system. This allows the clock measurement capability to remain available even in power-sensitive applications, aligning with the power consumption considerations discussed in relation to FIG. 1.

The apparatus 400 is particularly useful in the context of field-programmable gate arrays (FPGAs) and other programmable logic devices. These devices often have complex clock management systems with multiple clock domains and programmable clock generators. The ability to verify the frequencies of various clocks through the JTAG interface can simplify the process of validating a new FPGA configuration or diagnosing timing-related issues.

The apparatus 400 provides a flexible, efficient, and widely applicable solution for clock frequency measurement in JTAG-enabled devices. Its integration with the standard JTAG interface allows it to be easily incorporated into existing test and verification workflows, while its extensibility enables a range of advanced applications beyond basic frequency measurement.

Figure 5:
FIG. 5 illustrates a system diagram of a computing system, according to some implementations.

Referring to FIG. 5, a system diagram of a computing system 500 is illustrated according to some implementations. The system 500 comprises a host system 502 coupled to a hardware acceleration card 504. This system architecture provides a context for implementing the JTAG-based clock measurement system, allowing for integration of the clock measurement functionality at various levels of the system hierarchy.

The host system 502 includes one or more processors 506, a memory 508, and a bus 510 that couples various system components including memory 508 to processor(s) 506. Processor(s) 506 may include any of a variety of processors capable of executing program code. The processor architecture can affect the implementation of the clock measurement system, particularly in terms of how the JTAG interface is managed and how measurement data is processed.

Bus 510 represents one or more of any of several types of communication bus structures, including a memory bus or memory controller, a peripheral bus, an accelerated graphics port, and a processor or local bus using any of a variety of available bus architectures. The choice of bus architecture can impact the speed and efficiency of data transfer between the host system and the hardware acceleration card, potentially affecting the performance of the clock measurement system.

Host system 502 includes computer-readable media in the form of volatile memory, such as random-access memory (RAM) 512 and/or cache memory 514, as well as non-volatile storage system 516. These memory components can be utilized for storing configuration data, measurement results, and analysis software related to the clock measurement system.

Memory 508 may include at least one computer program product having a set of program modules 520 that are configured to carry out the functions and operations described within this disclosure. These program modules may implement a software stack that includes drivers or daemons capable of communicating with IC 532, which could house the JTAG-based clock measurement system.

Host system 502 includes one or more Input/Output (I/O) interfaces 528 communicatively linked to bus 510. These interfaces allow the host system to communicate with external devices, including the hardware acceleration card 504. The I/O interface used for communication with the hardware acceleration card is particularly relevant to the clock measurement system, as it determines how measurement commands are sent and results are retrieved.

In an example implementation, the I/O interface 528 through which host system 502 communicates with hardware acceleration card 504 is a PCIe adapter. This high-speed interface allows for efficient transfer of clock measurement commands and data between the host system and the hardware acceleration card.

Hardware acceleration card 504 includes IC 532, which could incorporate the JTAG-based clock measurement system described in previous figures. The card also includes volatile memory 534 and may include non-volatile memory 536, both coupled to IC 532. These memory components can be used for storing configuration data and measurement results local to the hardware acceleration card, potentially improving the speed and efficiency of the clock measurement process.

Figure 6:
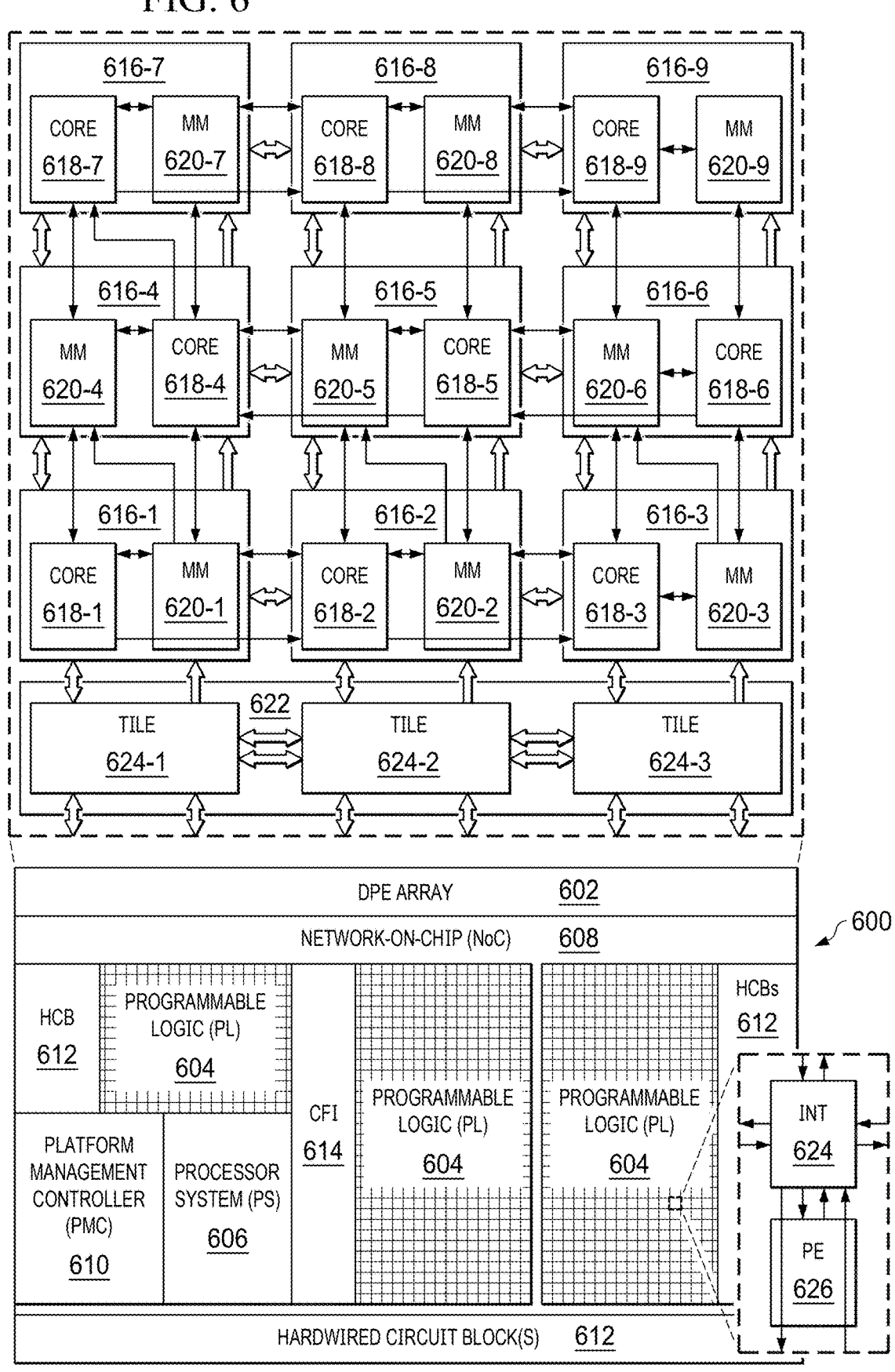
FIG. 6 illustrates a system diagram of an integrated circuit, according to some implementations.

Referring to FIG. 6, a system diagram of an integrated circuit (IC) 600 is illustrated. This IC could be an implementation of IC 532 from FIG. 5, and provides a more detailed view of how the JTAG-based clock measurement system might be integrated into a complex system-on-chip (SoC) design.

The IC 600 includes several major components: a data processing engine (DPE) array 602, programmable logic (PL) 604, a processor system (PS) 606, a Network-on-Chip (NoC) 608, a platform management controller (PMC) 610, and one or more hardwired circuit blocks 612. A configuration frame interface (CFI) 614 is also included. Each of these components could potentially incorporate clock domains that might be subjects for the clock measurement system.

The DPE array 602 consists of interconnected and programmable data processing engines (DPEs) 616, each containing one or more cores 618 and a memory module 620. The clock frequencies of these cores and their interconnects could be targets for measurement using the JTAG-based system.

The programmable logic (PL) 604 includes an array of programmable circuit blocks, each with a programmable element 626 and programmable interconnect 642. This programmable fabric could be used to implement custom logic for the clock measurement system, potentially allowing for more flexible or application-specific measurement techniques.

The processor system (PS) 606 could be used to control the clock measurement process, interpreting commands from the host system and managing the JTAG interface. It could also perform post-processing on the measurement results before sending them back to the host.

The Network-on-Chip (NoC) 608 provides high-speed data paths with dedicated switching, which could be used to efficiently route clock measurement data and control signals around the chip.

The platform management controller (PMC) 610 is responsible for managing the IC 600, including power management and configuration. It could play a role in enabling or disabling clock measurement functionality, or in configuring the system for low-power operation during periods when measurements are not being taken.

The hardwired circuit blocks 612 include special-purpose circuits that might have their own clock domains requiring measurement. These could include I/O blocks, transceivers, memory controllers, and other functional units.

The configuration frame interface (CFI) 614 allows for the loading of configuration data into the programmable logic. This interface could potentially be used to dynamically reconfigure parts of the system for different clock measurement scenarios.

In the context of the JTAG-based clock measurement system, this complex IC architecture presents both opportunities and challenges. The diverse array of clock domains and programmable resources allows for comprehensive clock frequency verification across the entire chip. However, it also requires careful design of the measurement system to handle this complexity, potentially involving multiple measurement points and sophisticated routing of measurement signals.

Figure 7:
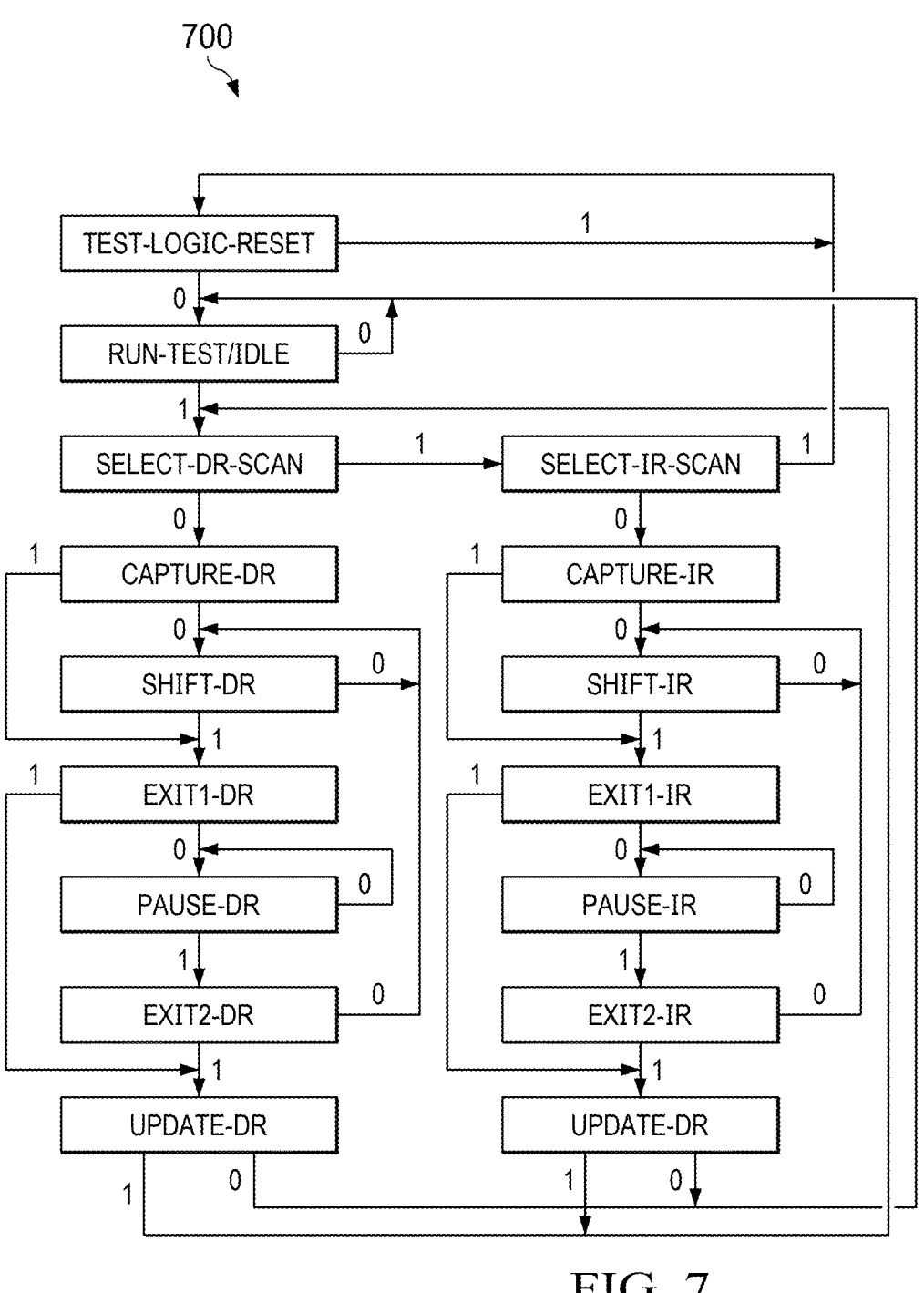
FIG. 7 illustrates a TAP state diagram for a JTAG system, according to some implementations.

Referring to FIG. 7, a TAP state diagram 700 for a JTAG system is illustrated. This diagram is fundamental to understanding the operation of the JTAG-based clock measurement system, as it defines the sequence of operations that must be performed to initiate, execute, and retrieve the results of a clock frequency measurement.

The diagram begins with the TEST-LOGIC-RESET state and shows transitions to other states based on input signals (0 or 1). The states are organized into two main paths: one for Data Register (DR) operations and another for Instruction Register (IR) operations.

In the context of the clock measurement system, a typical measurement sequence might involve the following state transitions:

1. TEST-LOGIC-RESET to RUN-TEST/IDLE: Initializes the system.
2. Through SELECT-IR-SCAN, CAPTURE-IR, SHIFT-IR, EXIT1-IR to UPDATE-IR: Loads the instruction for clock measurement.
3. Through SELECT-DR-SCAN, CAPTURE-DR, SHIFT-DR, EXIT1-DR to UPDATE-DR: Loads the count value and starts the measurement.
4. RUN-TEST/IDLE: Waits while the measurement is in progress.
5. Repeat steps 3-4 to retrieve the measurement results.

This state sequence allows for precise control over the measurement process, ensuring that each step is executed in the correct order and at the appropriate time.

Error handling can be incorporated into this process by checking for unexpected state transitions or by including error-checking steps in the DR or IR scan operations. For example, if an error is detected during the SHIFT-DR state while retrieving measurement results, the system could transition to EXIT1-DR and then to UPDATE-DR to abort the current operation, before returning to RUN-TEST/IDLE to attempt a retry or report the error.

The flexibility of the TAP state machine allows for implementation of more advanced measurement techniques. For instance, multiple measurements could be taken in succession by cycling through the DR path multiple times, or different types of measurements could be selected by loading different instructions through the IR path.

Power management considerations can also be addressed through the TAP state machine. The system could be designed to enter a low-power state when in the RUN-TEST/IDLE state for extended periods, with specific IR instructions defined to wake the system for measurements.

While the TAP state diagram provides a robust framework for implementing the clock measurement system, it also imposes some limitations. The serial nature of JTAG operations can limit the speed at which measurements can be initiated and results retrieved, particularly in systems with many clock domains to be measured. Future adaptations of the system might explore ways to parallelize operations or to use more efficient encoding of instructions and data to mitigate these limitations.

In summary, the system architecture presented in FIGS. 5 and 6, combined with the JTAG TAP state machine in FIG. 7, provides a comprehensive framework for implementing a flexible and powerful clock measurement system. This system can be integrated at various levels of the hardware hierarchy, from individual ICs to complex multi-chip systems, allowing for thorough verification of clock frequencies across diverse and complex digital designs.

The present disclosure describes a method and apparatus for measuring the frequency of an input clock using a Joint Test Action Group (JTAG)-based system. This approach extends the capabilities of standard JTAG testing infrastructure to include precise clock frequency measurement, enabling comprehensive system verification without requiring additional specialized testing equipment.

The disclosed system utilizes a counting mechanism to measure the frequency of an input clock signal. The apparatus includes a first counter that tallies the number of JTAG test clock cycles in a predetermined time interval, and a second counter that tallies the number of input clock cycles occurring within this interval. By comparing these two counts and knowing the frequency of the JTAG test clock, the system can determine the frequency of the input clock.

This method offers several advantages over traditional clock measurement techniques. It requires minimal additional hardware as it leverages existing JTAG infrastructure, reducing the need for specialized measurement equipment. The system provides non-invasive measurement capability, allowing clock frequencies to be measured without interrupting normal system operation. Furthermore, the system exhibits versatility in its ability to measure a wide range of clock frequencies, including those that are slower, faster, or the same as the reference clock frequency. The clock measurement functionality can be easily incorporated into standard JTAG-based test and verification processes, facilitating integration with existing test flows.

The method and apparatus are particularly valuable for verifying the correctness of clock sources during JTAG board testing. This capability addresses several common challenges in electronic system manufacturing and testing. It enables the detection of incorrect clock source devices on a board using cost-effective JTAG methods, and allows for the identification of improperly programmed clock sources for programmable devices that are not JTAG-capable. The system facilitates early detection of non-operational or disabled clock sources in the production test process. Moreover, it aids in the identification of clock sources operating at incorrect frequencies, which might not be discovered until later stages of production or during end-customer product usage.

The system can be implemented at various levels of the hardware hierarchy, from individual integrated circuits to complex multi-chip systems. It can be adapted to handle multiple clock inputs, either through multiplexing or by implementing multiple device counters. The flexibility of the JTAG TAP state machine allows for implementation of advanced measurement techniques, such as multiple successive measurements or different types of measurements selected through specific instructions.

While the system provides a robust framework for clock frequency measurement, it also considers practical limitations such as the serial nature of JTAG operations, which can affect measurement speed in systems with many clock domains. The disclosure suggests potential future adaptations, such as parallelizing operations or using more efficient encoding of instructions and data, to address these limitations.

By providing a means to verify clock frequencies early in the manufacturing process and throughout the product life-cycle, this method can significantly reduce production costs, improve overall product quality and reliability, and facilitate more efficient debugging and system verification processes. The versatility and efficiency of this JTAG-based clock measurement system make it a valuable tool for ensuring the quality and reliability of clock-dependent electronic systems across a wide range of applications and industries.

In an implementation, a method may include receiving an input clock at an input pin of a device, the device having a Joint Test Action Group (JTAG) test access port (TAP). The method may also include counting a first number of cycles of a reference clock using a first counter. The method may furthermore include simultaneously counting a second number of cycles of the input clock received at the input pin using a second counter. The method may in addition include calculating a frequency of the input clock based on the counted first number of cycles of the reference clock, the counted second number of cycles of the input clock, and a frequency of the reference clock.

The described implementations may also include one or more of the following features: the method where the input clock is an external clock source; the method where the input clock is an internal clock signal within the device; the method where the first counter and the second counter are implemented within a JTAG TAP logic of the device; the method where the first counter is a down counter and the second counter is an up counter; the method may include retrieving the first number and the second number through the JTAG TAP; the method where calculating the frequency of the input clock may include using a formula $Fin=Fref*Cdevice/Cref$, where Fin is the frequency of the input clock, Fref is the frequency of the reference clock, Cdevice is the second number of cycles of the input clock, and Cref is the first number of cycles of the reference clock;

the method may include selecting between multiple input clock signals using a multiplexer coupled to the second counter; the method may include resetting the first counter and the second counter prior to counting the first number of cycles of the reference clock and counting the second number of cycles of the input clock; the method where the first number of cycles of the reference clock to count is predetermined by an external JTAG controller.

In an implementation, a device may include a Joint Test Action Group (JTAG) test access port (TAP). The device may also include an input pin configured to receive an input clock signal. The device may furthermore include at least one counter configured to count cycles of the input clock signal. The device may in addition include JTAG TAP logic configured to control a clock frequency measurement process involving the at least one counter and the input clock signal and send a count result from the at least one counter through the JTAG TAP for external calculation of an input clock frequency.

The described implementations may also include one or more of the following features: the device where the at least one counter may include a first counter configured to count a first number of reference clock cycles and a second counter configured to count a second number of input clock cycles received at the input pin; the device where the first counter and the second counter are implemented within the device; the device where the second counter is implemented within the device and the JTAG TAP logic is configured to receive the first number of reference clock cycles from an external source; the device where controlling the clock frequency measurement process may include receiving a clock count instruction through the JTAG TAP, initiating a counting operation in response to the clock count instruction, and terminating the counting operation based on a predetermined condition; the device may include at least one JTAG clock count (CC) shift register coupled to the at least one counter, where the JTAG TAP logic is configured to load count values into or capture count values from the at least one counter through the at least one JTAG CC shift register; the device where the JTAG TAP logic is further configured to reset the at least one counter to an initial value, start the at least one counter, stop the at least one counter when a predetermined condition is met, and send a final value of the at least one counter through the JTAG TAP.

In an implementation, a system may include a device having a Joint Test Action Group (JTAG) test access port (TAP), an input pin configured to receive an input clock signal, and a device counter configured to count a number of input clock cycles. The system may furthermore include a JTAG controller external to the device, the JTAG controller having a reference clock, a JTAG counter configured to count a number of reference clock cycles, and a controller configured to control a clock frequency measurement process involving the JTAG counter and the device counter, retrieve a count value from the JTAG counter and the device counter, and calculate an input clock frequency based on the retrieved count value and a frequency of the reference clock.

The described implementations may also include one or more of the following features: the system where the JTAG controller is further configured to initialize the clock frequency measurement process by resetting the JTAG counter and the device counter simultaneously, start the JTAG counter and the device counter, stop the JTAG counter and the device counter after a predetermined number of reference clock cycles, and retrieve the count values after stopping the counters; the JTAG controller is configured to calculate the input clock frequency using a formula Fin=Fref*Cdevice/Cref, where Fin is the input clock frequency, Fref is the frequency of the reference clock, Cdevice is the retrieved count value from the device counter, and Cref is the retrieved count value from the JTAG counter.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular implementations described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding implementations described herein. Accordingly, the appended claims are intended to include within their scope such processes, machines, manufacture, compositions of matter, means, methods, or steps.

What is claimed is:

1. A method, comprising:
    receiving an input clock at an input pin of a device, the device comprising a Joint Test Action Group (JTAG) test access port (TAP);
    counting a first number of cycles of a reference clock using a first counter;
    simultaneously counting a second number of cycles of the input clock received at the input pin using a second counter; and
    calculating a frequency of the input clock based on the counted first number of cycles of the reference clock, the counted second number of cycles of the input clock, and a frequency of the reference clock.

2. The method of claim 1, wherein the input clock is an external clock source.

3. The method of claim 1, wherein the input clock is an internal clock signal within the device.

4. The method of claim 1, wherein the first counter and the second counter are implemented within a JTAG TAP logic of the device.

5. The method of claim 4, wherein the first counter is a down counter and the second counter is an up counter.

6. The method of claim 1, further comprising retrieving the first number and the second number through the JTAG TAP.

7. The method of claim 1, wherein calculating the frequency of the input clock comprises:
    using a formula: Fin=Fref*Cdevice/Cref, wherein Fin is the frequency of the input clock, Fref is the frequency of the reference clock, Cdevice is the second number of cycles of the input clock, and Cref is the first number of cycles of the reference clock.

8. The method of claim 1, further comprising selecting between multiple input clock signals using a multiplexer coupled to the second counter.

9. The method of claim 1, further comprising resetting the first counter and the second counter prior to counting the first number of cycles of the reference clock and counting the second number of cycles of the input clock.

10. The method of claim 1, wherein the first number of cycles of the reference clock to count is predetermined by an external JTAG controller.

11. A device, comprising:
    a Joint Test Action Group (JTAG) test access port (TAP);
    an input pin configured to receive an input clock signal;

at least one counter configured to count cycles of the input clock signal; and

JTAG TAP logic configured to:

control a clock frequency measurement process involving the at least one counter and the input clock signal, and send a count result from the at least one counter through the JTAG TAP for external calculation of an input clock frequency.

12. The device of claim 11, wherein the at least one counter comprises:

a first counter configured to count a first number of reference clock cycles; and a second counter configured to count a second number of input clock cycles received at the input pin.

13. The device of claim 12, wherein the first counter and the second counter are implemented within the device.

14. The device of claim 12, wherein the second counter is implemented within the device, and the JTAG TAP logic is configured to receive the first number of reference clock cycles from an external source.

15. The device of claim 11, wherein controlling the clock frequency measurement process comprises:

receiving a clock count instruction through the JTAG TAP;

initiating a counting operation in response to the clock count instruction; and terminating the counting operation based on a predetermined condition.

16. The device of claim 11, further comprising:

at least one JTAG clock count (CC) shift register coupled to the at least one counter, wherein the JTAG TAP logic is configured to load count values into or capture count values from the at least one counter through the at least one JTAG CC shift register.

17. The device of claim 11, wherein the JTAG TAP logic is further configured to:

reset the at least one counter to an initial value;

start the at least one counter;

stop the at least one counter when a predetermined condition is met; and send a final value of the at least one counter through the JTAG TAP.

18. A system, comprising:

a device comprising:

a Joint Test Action Group (JTAG) test access port (TAP), an input pin configured to receive an input clock signal, and a device counter configured to count a number of input clock cycles;

a JTAG controller external to the device, the JTAG controller comprising:

a reference clock, a JTAG counter configured to count a number of reference clock cycles, and a controller configured to:

control a clock frequency measurement process involving the JTAG counter and the device counter, retrieve a count value from the JTAG counter and the device counter, and calculate an input clock frequency based on the retrieved count value and a frequency of the reference clock.

19. The system of claim 18, wherein the JTAG controller is further configured to:

initialize the clock frequency measurement process by resetting the JTAG counter and the device counter;

simultaneously start the JTAG counter and the device counter;

stop the JTAG counter and the device counter after a predetermined number of reference clock cycles; and retrieve the count values after stopping the counters.

20. The system of claim 18, wherein the JTAG controller is configured to calculate the input clock frequency using a formula:

$$Fin = Fref * Cdevice / Cref$$

where Fin is the input clock frequency, Fref is the frequency of the reference clock, Cdevice is the retrieved count value from the device counter, and Cref is the retrieved count value from the JTAG counter.

* * * * *